United States Patent [19]

Hashima

[11] 4,320,533

[45] Mar. 16, 1982

[54] FREQUENCY STABILIZED DOWNCONVERTER FACILITATING OUTPUT FREQUENCY ALTERATION

[76] Inventor: Akio Hashima, c/o Matsushita Electric Industrial Co., Ltd., 1006 Kadoma, Osaka, Japan

[21] Appl. No.: 78,283

[22] Filed: Sep. 24, 1979

[30] Foreign Application Priority Data

Sep. 28, 1978 [JP] Japan .............................. 53-120052

[51] Int. Cl.³ .......................... H04B 1/16; H04N 5/44
[52] U.S. Cl. .................................. 455/259; 455/192;
 455/263; 455/190; 331/16; 331/18; 358/191.1
[58] Field of Search ............... 455/255, 257, 258, 259,
 455/190, 263, 264, 164, 169, 173, 182, 192, 196;
 331/16, 17, 18, 30, 32; 334/6, 16; 329/122, 123;
 358/191.1, 193.1, 195.1

[56] References Cited

U.S. PATENT DOCUMENTS

| | | | |
|---|---|---|---|
| 2,562,943 | 8/1951 | Pensyl | 455/259 |
| 2,843,740 | 7/1958 | Mantz | 455/255 |
| 3,085,210 | 8/1963 | Aasen | 455/259 |
| 3,678,394 | 7/1972 | Ebisch | 455/259 |
| 3,686,574 | 8/1972 | Niman | 455/259 |

*Primary Examiner*—Marc E. Bookbinder
*Assistant Examiner*—Tommy P. Chin
*Attorney, Agent, or Firm*—Wenderoth, Lind & Ponack

[57] ABSTRACT

A downconverter having a voltage controlled local oscillator supplied with a control DC voltage, obtained from a frequency discriminator and responding to variations of the difference between a reference produced by a stable oscillator and an output signal frequency of the downconverter is employed for facilitating output channel alterations without changing local oscillator stability characteristics. When used as a television channel converter, it changes a channel in the UHF or SHF band to VHF channels.

1 Claim, 4 Drawing Figures

FREQUENCY STABILIZED DOWNCONVERTER FACILITATING OUTPUT FREQUENCY ALTERATION

BACKGROUND OF THE INVENTION

This invention relates to a downconverter and more particularly to a television channel converter that changes television broadcasting channels in the UHF or SHF band to VHF television channels.

In the United States, a television channel, for example, the 2150 MHz to 2156 MHz channel slot is conventionally frequency-converted to VHF television channels such as channel 3 (60 to 66 MHz) or channel H (162 to 168 MHz) for reception by an ordinary television receiver. In such a case, a local oscillator of the downconverter operates at 2216 MHz or 2318 MHz. The requirement for the frequency drift of the local oscillator is ±100 KHz irrespective of the operating frequency and is fairly strict.

Therefore, a stable crystal oscillator for producing a reference frequency signal and means for multiplying the frequency of the crystal oscillator up to a required frequency are used for a stabilized local oscillator signal source. However, a crystal oscillator is unsuitable for frequency changes, and the required use of a multistage frequency multiplying circuit, necessitated by the use of a crystal oscillator, is known to have an operation limit of about 120 MHz and suffers from disadvantages in that spurious signal produced from each stage interfere with input signals or are radiated from an antenna terminal.

SUMMARY OF THE INVENTION

Accordingly, an object of this invention is to provide a downconverter with a stabilized local oscillator signal by using improved automatic frequency control.

Another object of this invention is to facilitate output channel alteration without changing oscillator stability characteristics.

Still another object of this invention is to provide a signal source which produces small spurious signals.

These objects are achieved according to this invention by providing a downconverter comprising: a local oscillator whose frequency is controlled by a DC voltage; a mixer for converting an input signal to an intermediate frequency output signal; a reference frequency signal oscillator; means for obtaining a difference frequency signal between said reference frequency signal and said output signal; a frequency discriminator for producing a DC control voltage proportioning to the drift of said difference frequency; and means for supplying said DC control voltage to said local oscillator so as to compensate for frequency drift in said local oscillator.

BRIEF DESCRIPTION OF THE DRAWINGS

This invention will be described in detail hereinafter with the aid of the accompanying drawings, in which.

DESCRIPTION OF PREFERRED EMBODIMENTS

Figure 1:
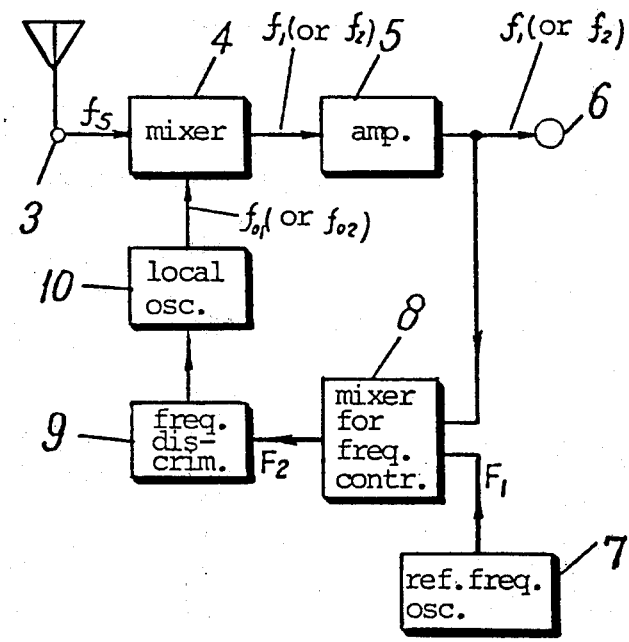
FIG. 1 is an electrical block diagram depicting an example of a downconverter of this invention.

Referring now to FIG. 1, there is shown a downconverter with an input signal appearing at an input terminal 3 from an antenna which is connected to a mixer 4 (frequency converter), where the input signal is heterodyned with a signal obtained from the output of a local oscillator 10. An intermediate frequency signal obtained from the output of the mixer 4 is amplified by an amplifier stage 5, and the signal from the amplifier 5 is coupled to an output terminal 6.

A portion of output signal from the output terminal 6 is supplied as one input to a mixer stage 8 for frequency control where the output signal is heterodyned with a signal obtained from the output of a reference frequency oscillator 7. An output difference frequency signal obtained from the output of the mixer 8 is fed to a frequency discriminator 9 which detects the frequency drift of the difference frequency; the output signal from the frequency discriminator 9 controls the frequency of the local oscillator 10. The local oscillator 10 is an electronically tunable oscillator.

The frequency of the output signal of the downconverter is usually selected, considering e.g. adjacent channel signals, so that variations of output channels occur due to the state of VHF broadcasting channels. If an output channel is changed when the frequency of the output signal is directly discriminated for obtaining a control voltage, it is necessary to change the center frequency of the frequency discriminator. This causes the stability of the local oscillator frequency to change due to the variations in the frequency discriminator characteristics such as sensitivity, stability, etc.

In order to suppress variations in the frequency discriminator characteristics, the output signal frequency is mixed with a reference frequency from a stable frequency source such as a crystal oscillator for obtaining a DC control voltage from the frequency discriminator whose center frequency is a standard difference frequency with respect to these frequencies. Thus, even if the output frequency is changed, a DC control voltage is obtained from the frequency discriminator with a fixed center frequency, provided that the difference frequency between an output frequency and the reference frequency is kept constant.

To establish the relationship between the output frequency, the reference frequency and the discriminator center frequency, the following formulas are used:

$$f_{ol} - f_s = f_1 (f_s < f_{ol}) \tag{1}$$

where $f_{ol}$ is the local oscillator frequency, $f_s$ is the input signal frequency and $f_1$ is the output signal frequency;

$$F_2 = F_1 - f_1 (f_1 < F_1) \tag{2}$$

where $F_2$ is the difference frequency and $F_1$ is the reference frequency. Therefore, from equations (1) and (2):

$$F_2 = F_1 - f_{ol} + f_s \tag{3}$$

Figure 2:
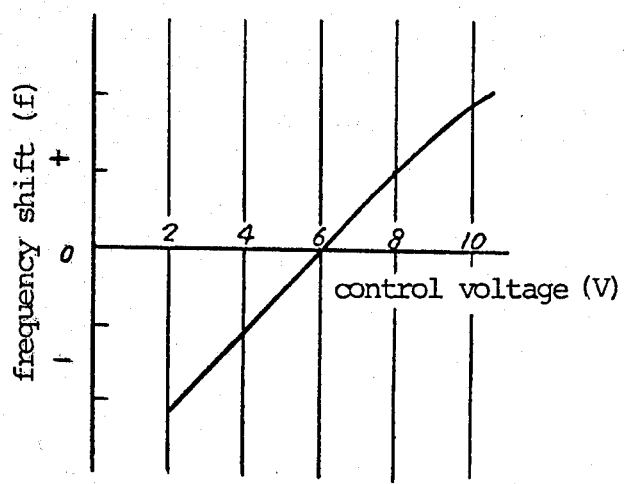
FIG. 2 is a graph showing an example of frequency deviation vs controlled voltage characteristics of the local oscillator.
Figure 3:
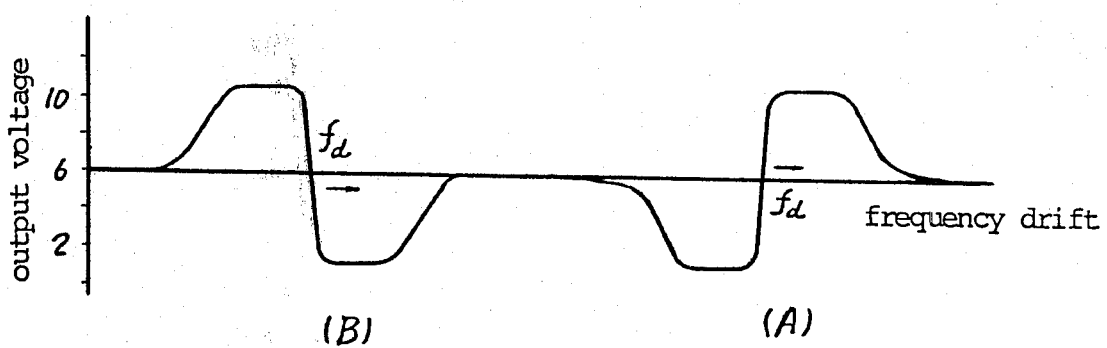
FIG. 3 is a graph showing an example of input frequency vs output DC voltage characteristics of the frequency discriminator.

When the reference frequency oscillator has a stable reference frequency, frequency drift $\Delta f$ in the local oscillator for operating at a frequency $F_1$ turns to frequency drift ($-\Delta f$) in the difference frequency signal. With the local oscillator 10 having frequency deviation vs controlled voltage characteristics as shown in FIG. 2, a frequency discriminator 9 of an operating center frequency $f_d = F_2$, having input frequency vs output DC voltage characteristics shown in FIG. 3 (A), and a reference frequency oscillator and mixer, together form a closed loop for frequency control, and the local oscillator frequency is stabilized and compensated for frequency drift.

When the output signal frequency $f_1$ is altered to $f_2$ ($f_1 < f_2$) by varying the local oscillator frequency $f_{o1}$ to $f_{o2}$, a difference frequency $F_2$ is expressed by the following equation:

$$F_2 = f_2 - F_1 \quad (f_2 < F_1) \tag{4}$$

From equations (2) and (4):

$$F_2 = f_{o2} - f_s - F_1 \tag{5}$$

Thus, the frequency drift $\Delta f$ in the local oscillator operating at a frequency $f_2$ turns into a frequency drift $\Delta f$ in the difference frequency signal. With the frequency discriminator 9 having input frequency vs output DC voltage characteristics shown in FIG. 3 (B), a closed loop for frequency control is formed, and the local oscillator frequency is similarly stabilized.

Figure 4:
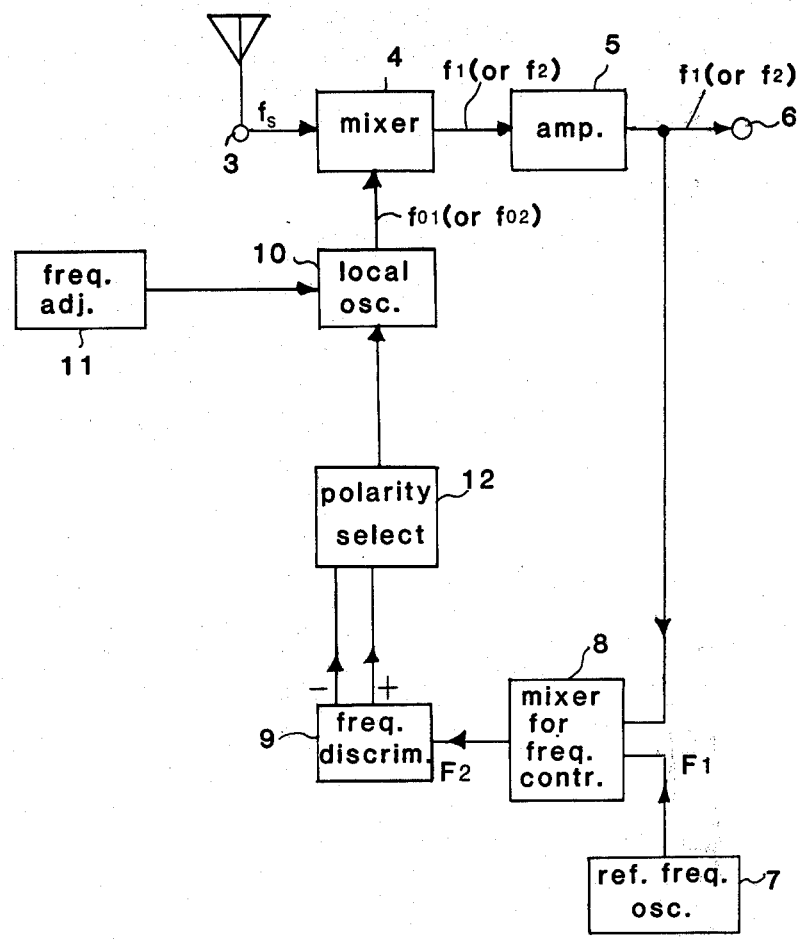
FIG. 4 is a slightly more detailed electrical block diagram of an embodiment of a downconverter of this invention.

In order to provide for the output signal frequency to be selected as $f_1$ or $f_2$, the reference frequency $F_1$ and discriminator center frequency $f_d$ are chosen so as to be expressed by the following equation:

$$F_2 = f_d = f_2 - F_1 = F_1 - f_1 \tag{7}$$

that is $F_1 = (f_1 + f_2)/2$, $f_d = (f_2 - f_1)/2$ whereby a common arrangement can be used for the reference frequency source and frequency discriminator without any frequency change. For example, when the output channel is chosen to be channel 3 (60 to 66 MHz, and a video carrier frequency of 61.25 MHz) or channel H (162 to 168 MHz, and a video carrier frequency of 163.25 MHz), the reference frequency is established as 112.25 MHz ($=(61.25+163.25)/2$), and the center frequency of frequency discriminator as 51 MHz ($=(163.25-61.25)/2$). Thus, in each selection of the output channel, it is only necessary to select the local oscillator frequency as 2210 MHz or 2312 MHz, and the output polarity of the frequency discriminator. Thus, each downconvertor with these frequency stabilized loops has a different output channel but a constant frequency stability. In order to provide such a downconverter, it is desirable to employ a frequency discriminator IC having a bi-polarity output for easy output polarity selection. FIG. 4 illustrates such an embodiment. In FIG. 4, a frequency adjusting means 11 is provided for varying the output signal frequency. A polarity selecting means 12 is provided for switching the output polarity of the frequency discriminator.

From these descriptions, it would be easily understood that a downconverter for channel 3 output having a reference oscillator operating at 112.25 MHz and a frequency discriminator having an operating center frequency of 51 MHz, is easily changeable to a downconverter for channel H output.

A downconverter in accordance with this invention minimizes the frequency drift of local oscillator as a result of an improved automatic frequency control loop by using a sensitive discriminator having a comparatively lower center frequency due to the operation at a difference frequency between a reference frequency and an output frequency, which is lower than the output frequency.

In addition, the downconverter provides a constant frequency stability in varying output frequency by keeping constant a discriminator frequency and by varying the reference frequency.

Furthermore, a downconverter having a chosen reference frequency $F_1 = (f_1 + f_2/2)$ and a discriminator center frequency $f_d = (f_2 - f_1/2)$ can alter the output frequency $f_1$ to $f_2$ or $f_2$ to $f_1$ without variation of any reference frequency.

The advantages of small spurious responses can also be obtained, resulting in a local oscillator having a stabilized fundamental frequency.

What is claimed is:

1. A downconverter comprising:
   a local oscillator whose frequency is controlled by a DC voltage and including a frequency adjusting means for varying an output signal frequency of said downconverter;
   a mixer for converting an input signal to an intermediate frequency output signal with the signal obtained from the output of said local oscillator;
   means for obtaining a difference frequency signal between a reference signal and said output signal whose frequency may be varied;
   a frequency discriminator having a fixed center frequency and producing a DC control voltage proportional to a drift of said difference frequency;
   a reference frequency signal oscillator for producing said reference signal whose frequency is chosen such that said difference frequency corresponds to said fixed center frequency of said discriminator when said output signal frequency is varied; and
   means for supplying said DC control voltage to said local oscillator so as to compensate for a frequency drift in said local oscillator;
   wherein the frequency of said output signal is set at one of two frequencies $f_1$ and $f_2$ by varying said local oscillator frequency, where each of said frequencies $f_1$ and $f_2$ is a video carrier frequency of television signals, and $f_2 > f_1$; said reference frequency signal oscillator operates at a frequency $F_1 = (f_1 + f_2/2)$, and said center frequency of said frequency discriminator is $f_d = (f_2 - f_1/2)$; and the output polarity of said frequency discriminator is selected so as to compensate for a frequency drift in said local oscillator in relation to said output signal frequency of frequency $f_1$ or $f_2$.

* * * * *